United States Patent

Hause et al.

[11] Patent Number: 6,140,674
[45] Date of Patent: *Oct. 31, 2000

[54] BURIED TRENCH CAPACITOR

[75] Inventors: Frederick N. Hause, Austin; Mark I. Gardner, Cedar Creek; Charles E. May, Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/123,117

[22] Filed: Jul. 27, 1998

[51] Int. Cl.$^7$ .............................. H01L 29/78; H01L 29/04
[52] U.S. Cl. ................... 257/301; 257/296; 257/532; 257/304; 257/305; 438/242
[58] Field of Search ............................. 257/301, 296, 257/300, 532, 520, 533, 302, 303, 305, 304; 438/242, 243, 386, 244, 387, FOR 220

[56] References Cited

U.S. PATENT DOCUMENTS

| | | | |
|---|---|---|---|
| 4,683,486 | 7/1987 | Chatterjee | 257/301 |
| 5,268,326 | 12/1993 | Lesk et al | 437/62 |
| 5,275,965 | 1/1994 | Manning | 437/67 |
| 5,283,461 | 2/1994 | Beasom | 257/520 |
| 5,552,620 | 9/1996 | Lu et al. | 257/330 |
| 5,672,537 | 9/1997 | Carl et al. | 437/67 |
| 5,702,969 | 12/1997 | Lee | 437/52 |
| 5,770,876 | 6/1998 | Lam et al. | 257/301 |
| 5,798,545 | 8/1998 | Iwasa et al. | 257/301 |
| 5,859,466 | 1/1999 | Wada | 257/520 |
| 6,020,230 | 2/2000 | Wu | 438/222 |

OTHER PUBLICATIONS

Stanley Wolf and Richard N. Tauber; *Silicon Processing for the VLSI Era, vol. 2–Process Integration*; pp. 56 and 587–609; 1990.

*Primary Examiner*—Leo P. Picard
*Assistant Examiner*—Hung Van Duong
*Attorney, Agent, or Firm*—Timothy M. Honeycutt

[57] ABSTRACT

An integrated circuit and a method of making the same are provided. The circuit includes a substrate that has a trench formed therein defining and isolating first and second active area and an upper surface. The circuit includes a capacitor that has a first insulating layer formed in the trench, a conductor layer formed on the first insulating layer, and a second insulating layer formed on the first insulating layer that fills the trench. The conductor layer is positioned substantially at or below the upper surface. The circuit integrates trench isolation structure with a capacitor that may be used as a filter between power and ground. The method integrates capacitor formation with trench isolation formation.

20 Claims, 5 Drawing Sheets

FIG. 5
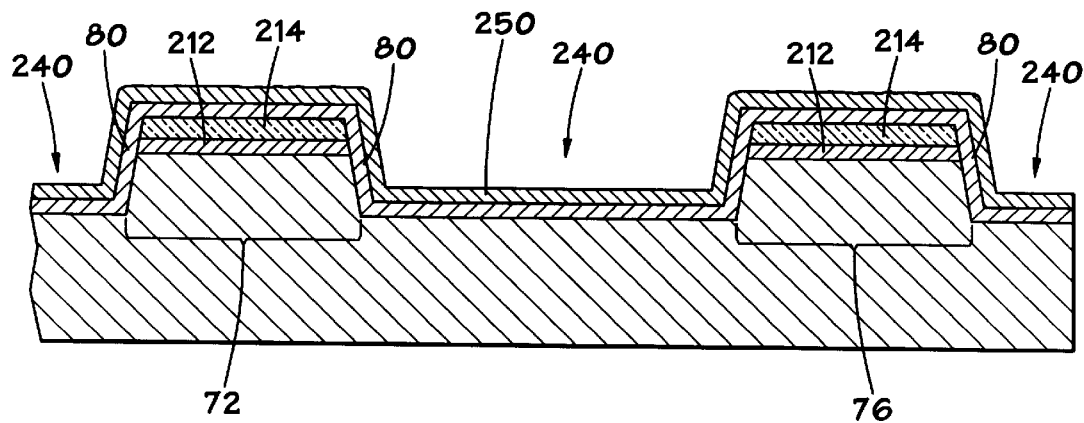
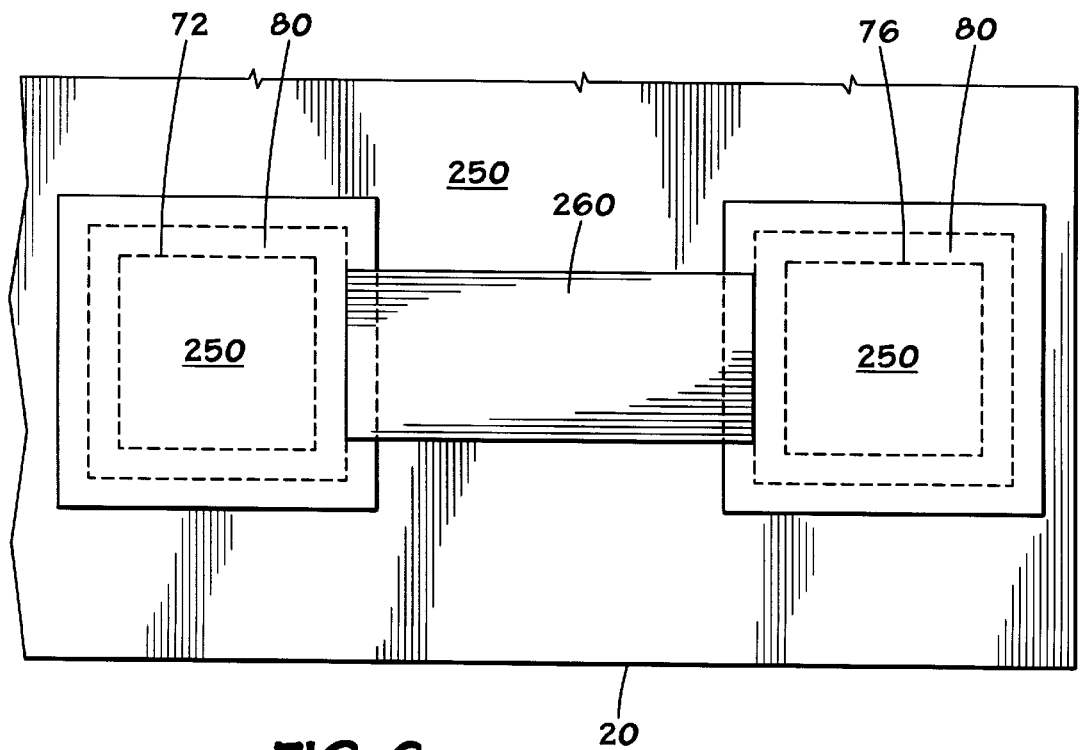
FIG. 6

FIG. 9
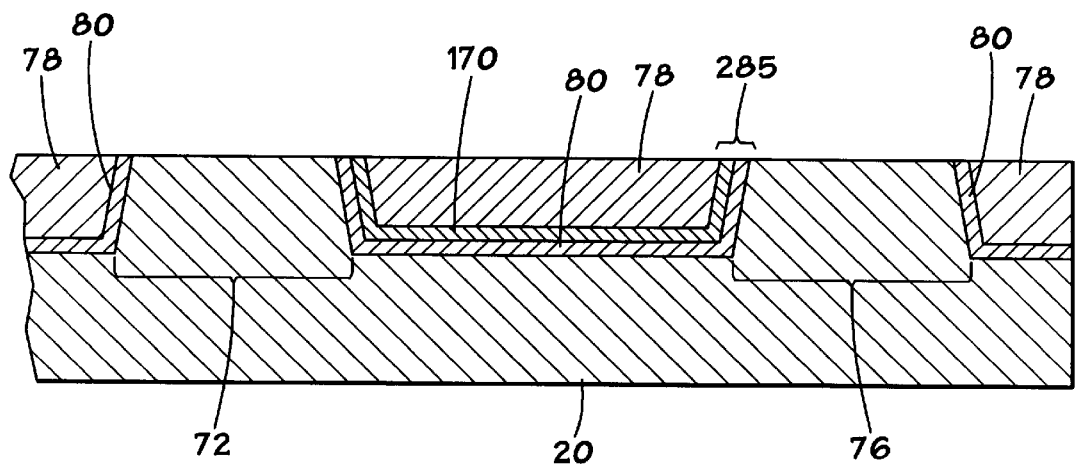
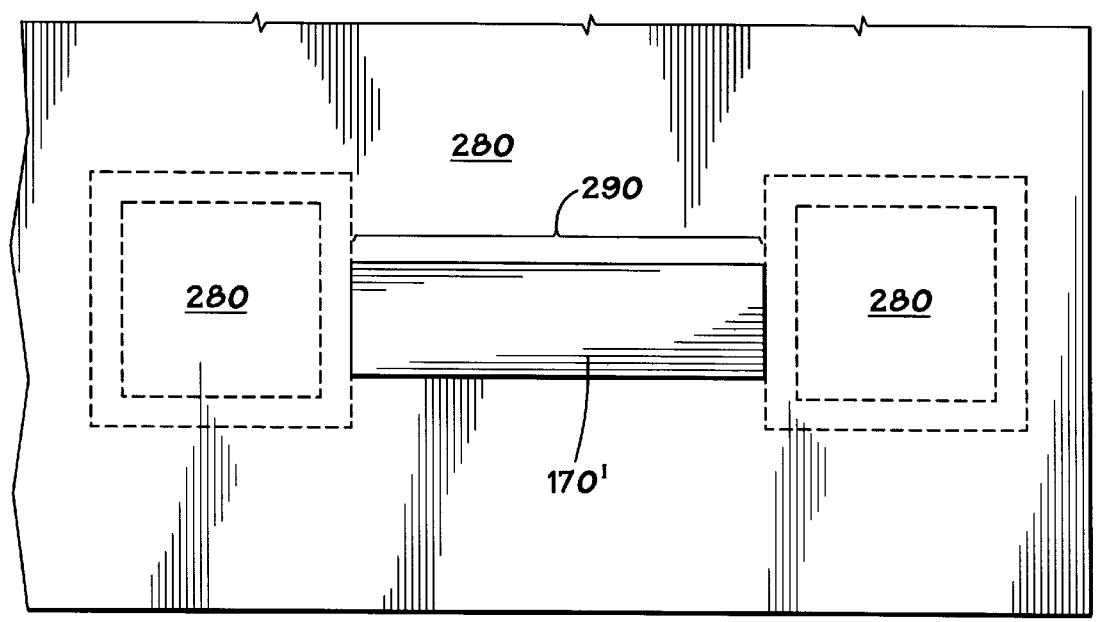
FIG. 10

BURIED TRENCH CAPACITOR

BACKGROUND OF THE INVENTION

1. Field of the Invention

This invention relates generally to semiconductor processing, and more particularly to a buried trench capacitor and to a method of making the same.

2. Description of the Related Art

Modem integrated circuits routinely contain millions of individual transistors and other electronic components. Most of the interconnections for the numerous components in such circuits are provided via one or more metallization layers that serve as global interconnect levels. Each metallization layer is ordinarily deposited on the substrate of the integrated circuit as a single continuous layer that is thereafter patterned lithographically and etched to remove metal from areas where metal lines are not required.

One type of metal line almost universally found on integrated circuits is a power line or rail that supplies power to some or all of the various components making up the circuit. The power rail is connected to external power via one or more pins in a packaged part or via a bump, bonding wire or other structure in a flip-chip mounted part, and is normally biased between zero and some nominal voltage. In most integrated circuits implemented on a semiconductor substrate, the substrate itself serves as a companion rail to the power rail. In many circuits, the substrate is at ground. In others, such as many types of random access memory circuits, the substrate is negatively biased.

Power lines, like other types of conductors connected directly to input/output nodes of an integrated circuit are susceptible to significant noise interference. Noise or other unusual variations in power voltage may degrade device performance or even lead to damaging latch up conditions, particularly in complimentary metal oxide semiconductor ("CMOS") devices. Accordingly, it is desirable to connect a filter between the power rails of an integrated circuit, i.e., the power line or lines and the substrate. A capacitor is commonly selected to serve as the power rail filter. The substrate and a conductor layer function as the capacitor plates and a dielectric layer between the two functions as the capacitor dielectric.

In some conventional semiconductor processes, power filter capacitor fabrication involves formation of a local interconnect layer on top of trench isolation material, that is, above the silicon-silicon dioxide interface. For these types of capacitors, the substrate functions as one of the capacitor plates, the local interconnect layer serves as the other capacitor plate, and the trench isolation material serves as the capacitor dielectric. The thickness of the capacitor dielectric, and thus the potential capacitance, for such a filter capacitor is dictated by the depth or thickness of the trench isolation material. The depth of the trench isolation material is, in turn, dictated by design considerations other than the performance of filter capacitors, such as anticipated junction depths and substrate dopant concentration.

There are several disadvantages associated with conventional filter capacitor fabrication. In many processes, trench isolation material is formed to a depth of several thousand angstroms or more. The potential capacitance of a capacitor utilizing such a relatively thick layer as a capacitor dielectric is accordingly limited. While the deleterious effects of relatively large dielectric thickness can be offset somewhat by making the local interconnect larger, bigger local interconnects translate into the consumption of additional chip area.

In addition, each local interconnect layer formed above the silicon-silicon dioxide interface in a given integrated circuit represents a potential restriction on the routing of other conductor lines, and thus the packing density, for the circuit. The problem of routing restriction is more complex when doped polysilicon is used as the local interconnect material. Doped polysilicon is often selected for local interconnect layers as a result of thermal budgeting or other design considerations. The polysilicon is frequently used as both a gate material and local interconnect material. As a result, when the polysilicon layer functions as an interconnect structure, it cannot cross over regions where a transistor gate exists without making contact to the gate. Unless such contacts with the gates are desired, gate locations represent areas on the substrate that cannot be crossed by polysilicon layers where these layers are being used as local interconnect layers.

Various techniques to overcome the polysilicon routing restrictions have been implemented in the past. Some of these include selectively forming $TiSi_2$ to form an LI level, sputter-depositing titanium-tungsten over $CoSi_2$ contacts, forming a titanium nitride layer over a $TiSi_2$ contact, and forming a dual-doped polysilicon LI with diffused source/drain junctions. While these techniques alleviate some of the routing difficulties associated with polysilicon local interconnect layers, they also increase processing steps and complexity. Furthermore, cluttering of the substrate area above the silicon-silicon dioxide interface remains a problem.

The present invention is directed to overcoming or reducing the effects of one or more of the foregoing disadvantages.

SUMMARY OF THE INVENTION

In accordance with one aspect of the present invention, an integrated circuit is provided. The integrated circuit includes a substrate that has a trench formed therein defining and isolating first and second active areas and an upper surface. The circuit includes a capacitor that has a first insulating layer formed in the trench, a conductor layer formed on the first insulating layer, and a second insulating layer formed on the first insulating layer that fills the trench. The conductor layer is positioned substantially at or below the upper surface.

In accordance with another aspect of the present invention, an integrated circuit is provided. The integrated circuit includes a substrate that has a trench formed therein defining and isolating first and second active areas, and an upper surface. A layer of isolation material is in the trench to isolate the first and second active areas. A capacitor is provided that has a first insulating layer in the trench beneath the layer of isolation material, and a conductor layer formed on the first insulating layer. The conductor layer is positioned substantially at or below the upper surface. A power conductor is provided on the substrate and coupled to the conductor layer. The capacitor functions as a filter between the conductor and the substrate.

BRIEF DESCRIPTION OF THE DRAWINGS

The foregoing and other advantages of the invention will become apparent upon reading the following detailed description and upon reference to the drawings in which:

FIG. 5 is a cross-sectional view like FIG. 4 depicting formation of a conductor layer on the first insulating layer in accordance with the present invention;

FIG. 6 is a plan view of the substrate depicted in FIG. 5 following application of a mask over the conductor layer and patterning of the mask into the desired layout of the buried conductor layer in accordance with the present invention;

FIG. 9 is a cross-sectional view like FIG. 8 depicting planarization of the second insulating layer in accordance with the present invention; and FIG. 10 is a plan view like FIG. 6 depicting an alternate exemplary process for masking and defining the buried conductor layer in accordance with the present invention.

DETAILED DESCRIPTION OF SPECIFIC EMBODIMENTS

Figure 1:
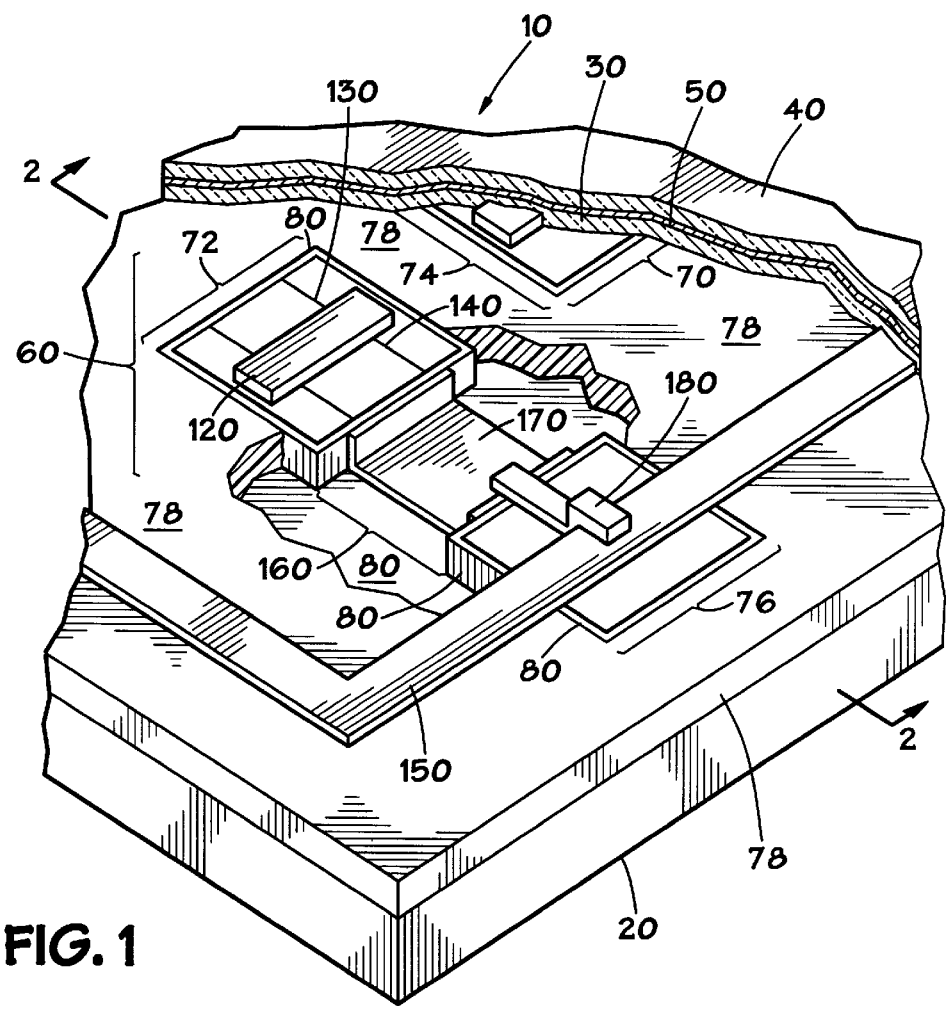
FIG. 1 is a pictorial view of an exemplary embodiment of an integrated circuit incorporating a buried trench capacitor in accordance with the present invention.
Figure 2:
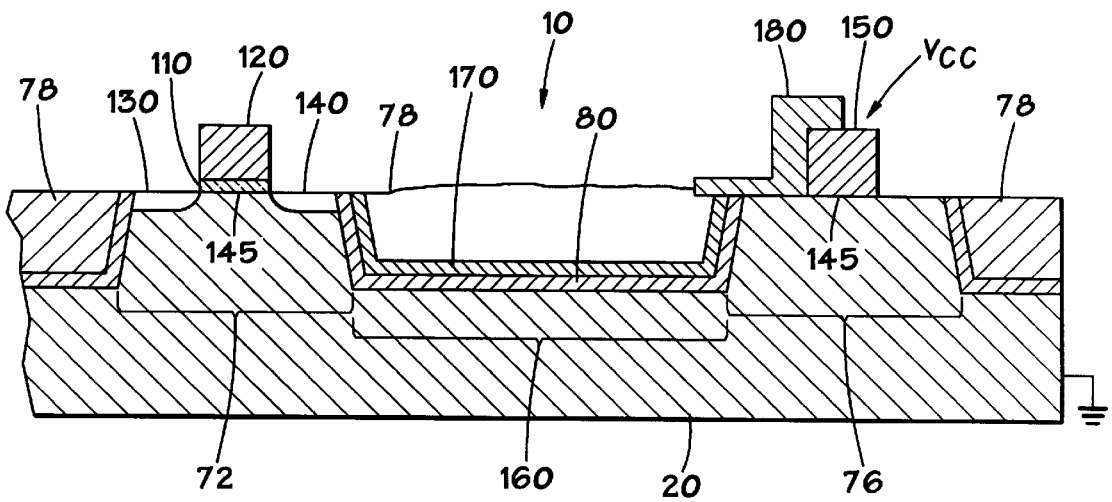
FIG. 2 is a cross-sectional view of FIG. 1 taken at section 2—2.

In the drawings described below, reference numerals are generally repeated where identical elements appear in more than one figure. Turning now to the drawings, and in particular to FIGS. 1 and 2, there is shown a pictorial view and a cross-sectional view of an exemplary embodiment of an integrated circuit 10 that includes a substrate 20, two or more interlevel dielectric layers 30 and 40, and at least one metallization layer 50 sandwiched between the interlevel dielectric layers 30 and 40. The layers 30, 40, and 50 are not shown in FIG. 2. The metallization layer 50 serves as a global interconnect layer to provide interconnection for the various components in the integrated circuit 10. The interlevel dielectric layers 30 and 40 and the metallization layer 50 have been peeled away to reveal electronic components 60 and 70 formed on respective active areas 72 and 74 of the substrate 20. A third active area 76 is also provided. The active areas 72, 74 and 76 are electrically isolated by a layer of shallow trench isolation ("STI") material 78. The term "active area" is intended to mean a portion of the substrate 20 that is isolated from another portion of the substrate 20 by the STI layer 78. A given active area may or may not contain an electronic component. For example, the active areas 72 and 74 contain the components 60 and 70 while the active area 76 does not contain a component.

Although the integrated circuit 10 may contain many components, for simplicity of illustration, only two components 60 and 70 are shown. For the purpose of this illustration, the components 60 and 70 are depicted as field effect transistors. However, the components may be transistors, capacitors, or any of a variety of different types of electronic components implemented in integrated circuits.

The active areas 72, 74 and 76, and thus the transistors 60 and 70 are electrically isolated by a first insulating layer or liner 80, and by the STI layer 78. The transistor 60 includes a gate dielectric layer 110 formed on the substrate 20 and a gate electrode 120 formed on the gate dielectric layer 110. Source/drain regions 130 and 140 are formed laterally and self-aligned to the gate electrode 120 in the substrate 20. The phrase "source/drain region(s)" is used herein to describe a region that may serve as either a source or a drain. The skilled artisan will appreciate that a source/drain region may function as a source or a drain depending upon whether it is connected to $V_{SS}$ or $V_{DD}$ during metallization. For the purpose of this illustration, the transistor 70 is substantially identical to the transistor 60. The silicon-silicon dioxide interface for the substrate 20 is designated generally at 145.

A conductor 150 is formed on the STI layer 78 and is routed over the active area 76. For the purpose of this illustration, the conductor 150 functions as a power rail for supplying power at a voltage $V_{CC}$ to various components of the integrated circuit 10. The substrate 20 functions as the companion rail at ground as shown in FIG. 2. The conductor 150 may be composed of a variety of conducting materials, such as aluminum, copper, aluminum-copper alloy, polysilicon, or like materials.

A portion of the STI layer 78 has been cut away in FIG. 1 to reveal an exemplary embodiment of a buried trench capacitor 160 (hereinafter "capacitor 160") that functions as a filter capacitor between the power rails, i.e., the conductor 150 at $V_{CC}$ and the substrate 20 at ground. The buried trench capacitor 160 includes the substrate 20 serving as a lower plate, the liner layer 80 serving as a capacitor dielectric, and a buried conductor layer 170 serving as a top plate. Electrical connection between the buried conductor layer 170 and the conductor 150 is established by a local interconnect strap 180.

Figure 3:
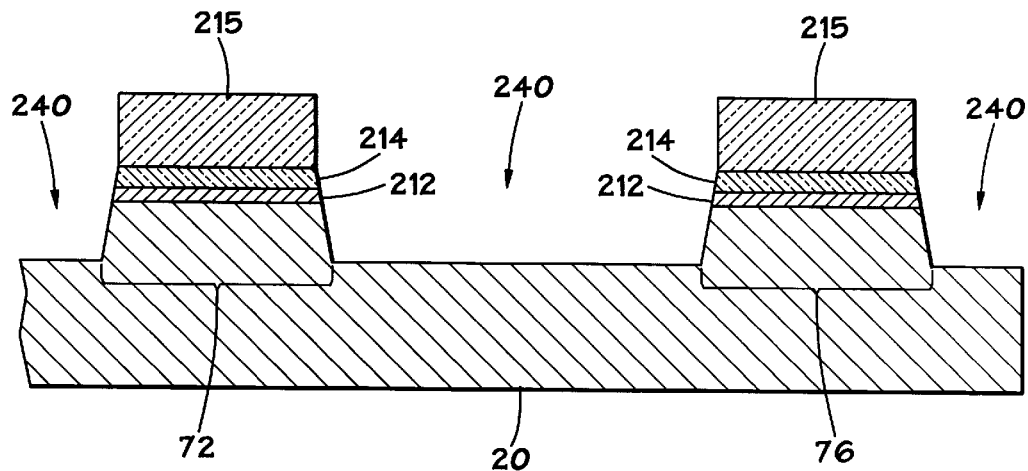
FIG. 3 is a cross-sectional view like FIG. 2 depicting formation of a trench in a substrate in accordance with the present invention.

An exemplary process flow for forming the buried trench capacitor 160 depicted in FIGS. 1 and 2 may be understood by referring now to FIGS. 3, 4, 5, 6, 7, and 8 and initially to FIG. 3. Initially, the substrate 20 is provided with a pad oxide layer 212 and a $Si_3N_4$ layer 214 formed on the pad oxide layer 212. The pad oxide layer 212 may have a thickness of about 50 to 200 Å and advantageously about 100 Å, and is advantageously formed by thermal oxidation in a rapid thermal anneal ("RTA") process at about 800 to 1100° C. for about 5 to 20 seconds or other suitable process. The $Si_3N_4$ layer 214 may be formed by chemical vapor deposition ("CVD") or other suitable nitride application technique and may have a thickness of about 1000 to 2000 Å, and advantageously about 1200 Å. The pad oxide layer 212 and the $Si_3N_4$ layer 214 are designed to protect the substrate 20 from contamination and damage during subsequent processing.

The substrate 20 is masked with photoresist 215 or other suitable masking material, and the photoresist is patterned, that is, exposed and developed to define the active areas 72, 74 and 76. The substrate 20 may be composed of n-doped or p-doped silicon, silicon-on-insulator, or other suitable substrate materials. After the photoresist 215 has been patterned, a trench 240 is formed in the substrate 20, advantageously by reactive ion etching, plasma etching, or other suitable anisotropic removal techniques. The etch process may be tailored to establish tapered sidewall profiles for the trench 240 as shown in FIG. 3 or substantially vertical profiles as desired. In this exemplary process flow, the trench 240 is formed essentially as a moat-like structure around the active areas 72, 74 and 76 to provide space for deposition of the STI layer 78 depicted in FIGS. 1 and 2 during subsequent processing. However, the trench 240 may alternatively be formed as a more localized void in the substrate 20 that stretches from one active area of the substrate to another. The depth of the trench 240 is largely a matter of design discretion. In an exemplary embodiment, the trench 240 has a depth of about 3000 to 4000 Å. Following formation of the trench 240, the photoresist 215 is stripped.

Figure 4:
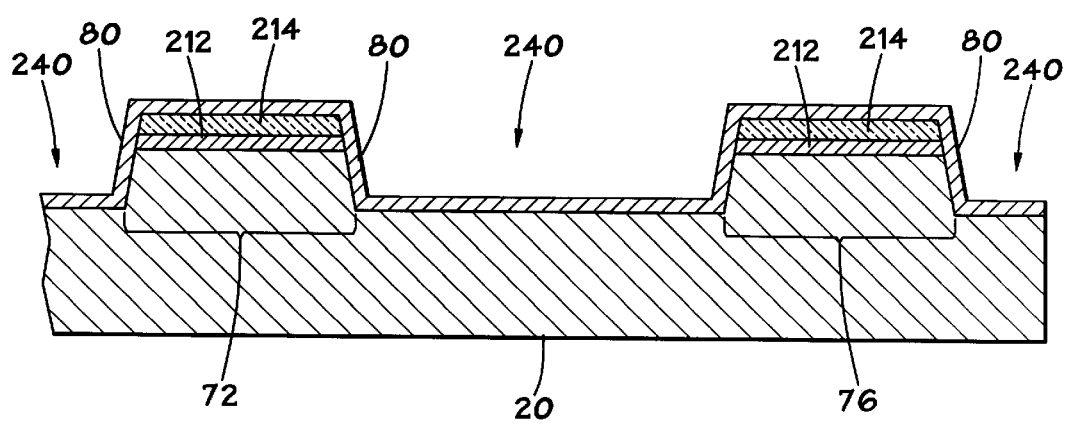
FIG. 4 is a cross-sectional view like FIG. 3 depicting formation of a first insulating layer in the trench in accordance with the present invention.

Referring now to FIG. 4, the first insulating layer 80 is formed in the trench 240 so that the bottom as well as the sidewalls of the trench 240 are covered with an insulating material. The layer 80 is designed to protect the underlying substrate 25 from contamination and/or structural damage during subsequent processing. Accordingly, the layer 80 may be composed of silicon dioxide, silicon nitride, a combination of the two, or like materials. If silicon dioxide is selected, the layer 80 may be fabricated by dry oxidation of the substrate 20. In an exemplary process, the substrate 20 is exposed to an $O_2$ containing ambient at about 800 to about 1150° C. for between about 5 to 20 minutes. A suitable RTA process or CVD may also be used. If a silicon dioxide-silicon nitride mix is selected, CVD may be used. The layer 80 may be about 100 to 1000 Å thick and is advantageously about 500 Å thick. The layer 80 functions as the dielectric for the buried trench capacitor 160. The skilled artisan will appreciate the layer 80 is significantly thinner than the STI layer 78 that is often used as a capacitor dielectric in conventional processing. Accordingly, the buried trench capacitor 160 may be fabricated with a higher capacitance than is attainable for a given substrate area.

Referring now to FIG. 5, a conductor layer 250 is formed on the first insulating layer 80. The conductor layer 250 will be subsequently processed to define the buried conductor layer 170 depicted in FIGS. 1 and 2. Accordingly, the conductor layer 250 may be composed of a variety of conducting materials, such as doped polysilicon, aluminum, copper, or other suitable conducting materials. The layer 250 is advantageously composed of doped polysilicon and may be deposited by CVD or other suitable techniques for forming polysilicon. The conductor layer 250 is doped with a dopant, such as phosphorus, by in situ diffusion or by ion implantation subsequent to deposition of the polysilicon, in a sufficient concentration to render the layer 250 conductive. The required doping level will depend upon the resistivity requirements for the buried local interconnect. In an exemplary embodiment, the dopant concentration for phosphorus is about $10^{19}$ atoms/cm$^3$. The layer 250 may be about 250 to 1000 Å thick and is advantageously about 600 Å thick.

Figure 7:
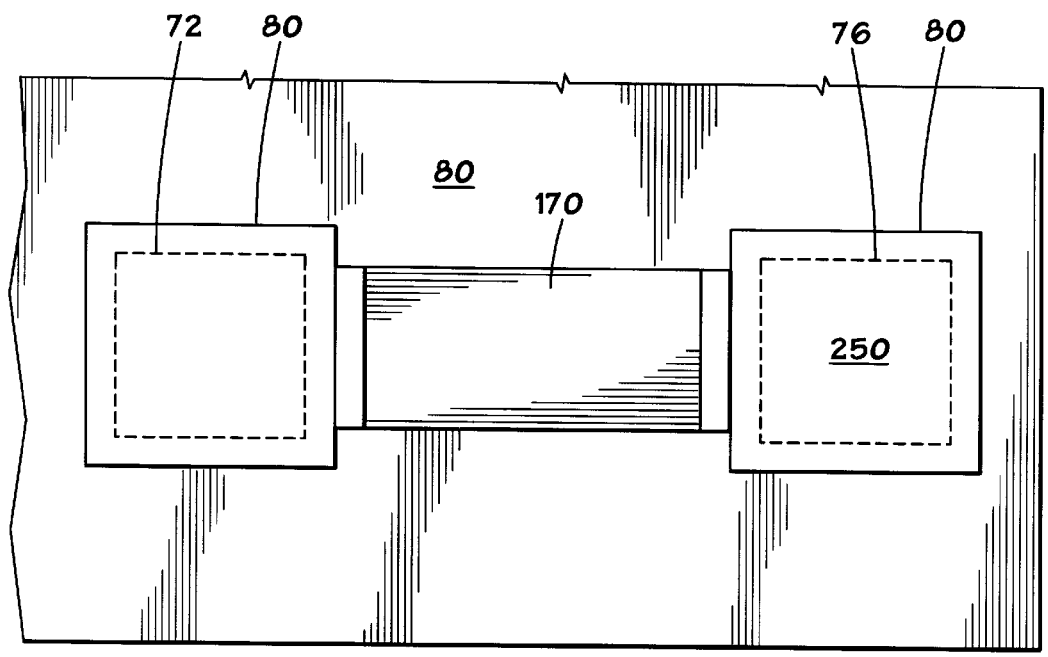
FIG. 7 is a plan view like FIG. 6 depicting the defined buried conductor layer in accordance with the present invention.

FIGS. 6 and 7 are plan views of the substrate 20 following the processing depicted up through FIG. 5. The active areas 72 and 76 are shown in phantom as well as the outline of the portions of layer 80 that surround the sidewalls of the active areas 72 and 76. A portion of the conductor layer 250 is removed to define the buried conductor layer 170. The conductor layer 250 is masked with photoresist or other suitable masking material and the mask is patterned to leave a portion of photoresist 260 corresponding to the layout of the buried conductor layer 190. The unmasked portion of the conductor layer 250 is then removed by reactive ion etching, plasma etching, or other suitable anisotropic etching techniques and the photoresist 260 is stripped to leave the defined buried conductor layer 170 as shown in FIG. 7. Removal of the unmasked portions of the conductor layer 250 exposes the first insulating layer 80. At this stage, the buried trench capacitor 160 is complete and ready for application of the STI layer 78 and interconnection with a conductor, such as the conductor 150 shown in FIGS. 1 and 2 and formed in later processing.

Figure 8:
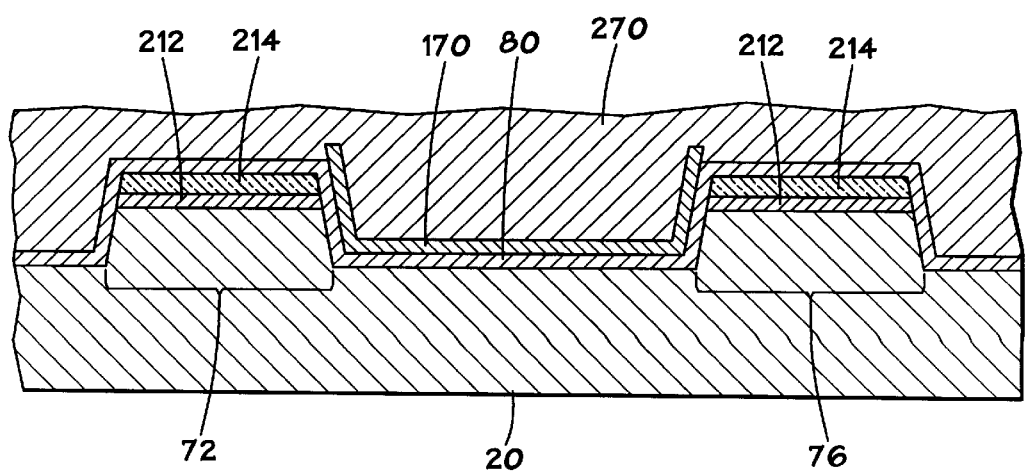
FIG. 8 is a cross-sectional view like FIG. 5 depicting formation of a second insulating layer over the buried conductor layer in accordance with the present invention.

Referring now to FIG. 8, a second insulating layer 270 is formed in the trench 240 and covers the buried conductor layer 170. Through subsequent processing, the second insulating layer 270 will be transformed into the STI structures 78 shown in FIGS. 1 and 2. Accordingly, the second insulating layer 270 is advantageously composed of silicon dioxide, TEOS or other suitable trench isolation materials. The second insulating layer 270 is advantageously applied by CVD and a reflow step may be performed as desired. The layer 270 may have a thickness of 1.0 to 1.5 µm and is advantageously about 1.0 µm.

Referring now to FIG. 9, the second insulating layer 270 and the portions of the layer 80 overlying the active areas 72 and 76 are planarized back to the nitride layers 214 by chemical-mechanical-polishing ("CMP") or other suitable planarization technique. The nitride layer 214 is etched away, and, if desired, the pad oxide layer 212 may also be etched away. Prior to etching the silicon nitride and pad oxide layers 214 and 212, the substrate is reverse masked so that only the silicon nitride layer 214 and the pad oxide layer 212 are exposed to the etches. The etch mask (not shown) is then stripped.

Referring again to FIG. 2, the transistors 60 and 70 are formed. The following description of the transistor 60 is exemplary of the transistor 70. Initially, the gate dielectric layer 10 is formed on the substrate 20. The layer 110 may be silicon dioxide or other suitable gate dielectric material, and may be formed by thermal oxidation or CVD. The gate electrode 120 may be formed by depositing a conductor material, such as polysilicon, by CVD. The gate dielectric layer 10 and the electrode 120 are then patterned and anisotropically etched to the desired shapes. The source/drain regions 130 and 140 may then be formed by ion implantation or diffusion as desired. The dosage and energy for the implants is largely a matter of design discretion and will depend upon the dopant type selected. The source/drain regions 130 and 140 may be formed through a double implant process, where lightly doped drain structures are initially established.

The conductor 150 may be formed in the well known manner of depositing a layer of conducting material on the substrate 20, masking the conducting layer with a suitably patterned mask and etching away the unmasked portions. For example, aluminum may be deposited by sputter deposition, CVD or like techniques and masked with photoresist. The aluminum layer may then be reactive ion etched and the mask stripped to yield the conductor 150.

Referring now to FIGS. 2 and 9, interconnection between the buried trench capacitor 160 and the conductor 150 may be established by forming a via in the STI structure 78 at the area designated 275 in FIG. 9 to expose the vertically projecting portions of the buried conductor layer 170. If the vertically projecting portions are already exposed following planarization, via formation will not be necessary. The local interconnect strap 180 may then be formed over the via to interconnect the buried conductor layer 170 to the conductor 150. The strap 180 is advantageously composed of a conducting material, such as, aluminum, tungsten, or like materials, and may be applied by sputter deposition or similar techniques. A masking step is used to pattern the strap 180.

The formation of the buried trench capacitor 160 has been illustrated on the context of a filter capacitor for the power rails, i.e., the conductor 150 and the substrate 20, of the integrated circuit 10. However, the skilled artisan will appreciate that the buried trench capacitor 160 may be implemented on the substrate 20 at virtually any location where a capacitor is needed to implement a desired circuit.

An alternate embodiment of the process flow in accordance with the present invention may be understood by referring now to FIGS. 4 and 10. In this embodiment, the buried conductor layer, now designated 170', is defined in a damascene process in which the first insulating layer 80 is coated with a mask 280 that is lithographically patterned and etched to form a trench 290 in which conducting material for the buried conductor layer 170' may be deposited by CVD or like processes. FIG. 10 is a plan view of the substrate 20 following application of the mask 280 and patterning and etching of the mask 280 to define the trench 290. The trench 290 corresponds to the desired layout for the buried conductor layer 170'. Conducting material will be deposited into the trench 290 to establish the buried conductor layer 170'. The material selected for the mask 280 must be able to withstand the temperatures associated with the CVD process for depositing conducting material into the trench 290. In this regard the mask 280 may be advantageously composed of silicon dioxide that may be applied over the layer 80 by CVD or thermal oxidation. The mask 280 may then be masked and anisotropically etched by reactive ion etching, plasma etching, or other suitable anisotropic etching techniques to establish the trench 290. The buried conductor layer 170' may then be formed in the trench 290 by CVD and the mask 280 removed by a blanket etch of the substrate 20. Following definition of the buried conductor layer 170', the process flow described above in conjunction with FIGS. 8 and 9 may be followed.

The process of the present invention provides for formation of a capacitor at or beneath the silicon-silicon dioxide interface, and in the relatively uncluttered STI regions between active areas of an integrated circuit. Valuable chip area above the silicon-silicon dioxide interface, that would otherwise be taken up by the top capacitor plate and various local interconnect layers in conventional processing, may now be used for other purposes. For example, the vacated areas above the interface may be used to incorporate additional circuit components. Similarly, metallization layout flexibility may be enhanced. Since the process is integrated with STI trench formation, separate substrate etching is unnecessary. Lastly, the use of the relatively thin liner layer 80 as a capacitor dielectric provides for much higher capacitances than in conventional processing.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An integrated circuit, comprising:
   a substrate having a trench formed therein defining and isolating first and second active areas and a first upper surface; and
   a capacitor having a first insulating layer formed in the trench, a conductor layer formed on the first insulating layer, and a second insulating layer formed on the conductor layer and having a second upper surface that is substantially planar with the first upper surface, the conductor layer being positioned substantially at or below the first upper surface.

2. The integrated circuit of claim 1, wherein the first active area includes a transistor.

3. The integrated circuit of claim 1, comprising a conductor coupled to the conductor layer, whereby the capacitor is a filter between the conductor and the substrate.

4. The integrated circuit of claim 1, wherein the conductor layer comprises doped polysilicon.

5. The integrated circuit of claim 1 wherein the first and second insulating layers comprise silicon dioxide.

6. The integrated circuit of claim 1, wherein the first insulating layer comprises silicon dioxide and the second insulating layer comprises TEOS.

7. The integrated circuit of claim 2, wherein the transistor comprises a field effect transistor.

8. The integrated circuit of claim 3, comprising a conductor strap coupled between the conductor and the conductor layer.

9. An integrated circuit, comprising:
   a substrate having a trench formed therein defining and isolating first and second active areas, and a first upper surface;
   a layer of isolation material in the trench to isolate the first and second active areas and having a second upper surface that is substantially planar with the first upper surface;
   a capacitor having a first insulating layer in the trench beneath the layer of isolation material, and a conductor layer formed on the first insulating layer, the conductor layer being positioned substantially at or below the first upper surface; and
   a power conductor on the substrate and coupled to the conductor layer, whereby the capacitor is a filter between the conductor and the substrate.

10. The integrated circuit of claim 9, wherein the first active area includes a transistor.

11. The integrated circuit of claim 9, comprising a conductor strap coupled between the power conductor and the conductor layer.

12. The integrated circuit of claim 10, wherein the transistor comprises a field effect transistor.

13. The integrated circuit of claim 12, wherein the conductor layer comprises doped polysilicon.

14. The integrated circuit of claim 13, wherein the first and second insulating layers comprise silicon dioxide.

15. The integrated circuit of claim 13, wherein the first insulating layer comprises silicon dioxide and the second insulating layer comprises TEOS.

16. An integrated circuit, comprising:
   a substrate having a trench therein with opposing sidewalls defining and isolating first and second active areas, and a first upper surface;
   a capacitor positioned in trench and having a first insulating layer covering the opposing sidewalls, and a conductor layer on the first insulating layer having vertically projecting portions adjacent to the opposing sidewalls and being positioned substantially at or below the first upper surface;
   a layer of insulating material positioned on the conductor layer between the vertically portions and having a second upper surface that is substantially planar with the first upper surface; and
   a power conductor on the substrate and coupled to the conductor layer, whereby the capacitor is a filter between the conductor and the substrate.

17. The integrated circuit of claim 16, wherein the first active area includes a transistor.

18. The integrated circuit of claim 16, wherein the conductor layer comprises doped polysilicon.

19. The integrated circuit of claim 16, wherein the first insulating layer comprises silicon dioxide and the second insulating layer comprises TEOS.

20. The integrated circuit of claim 17, wherein the transistor comprises a field effect transistor.

* * * * *

UNITED STATES PATENT AND TRADEMARK OFFICE
CERTIFICATE OF CORRECTION

PATENT NO. : 6,140,674
DATED : October 31, 2000
INVENTOR(S) : Frederick N. Hause et al.

It is certified that error appears in the above-identified patent and that said Letters Patent is hereby corrected as shown below:

Title page,
Insert the following under U.S. PATENT DOCUMENTS:
-- 5,070,388     12/1991     Wade et al.     437/67 --;

Insert the following under OTHER PUBLICATIONS:
-- IBM; *"Single-Crystal Silicon Embedded With Insulated Conducting Wires"*; IBM Technical Disclosure Bulletin; Vol. 32; No 3B; pp. 403-407; August 1989 --;

Column 1,
Line 9, delete "Modem" and substitute -- Modern -- therefor;

Claims,
Claim 16,
Insert the word -- projecting -- between the phrases "the vertically" and "portions and having".

Signed and Sealed this

Sixteenth Day of October, 2001

Attest:

NICHOLAS P. GODICI
Attesting Officer     *Acting Director of the United States Patent and Trademark Office*